United States Patent
Kleindienst

(10) Patent No.: US 9,267,969 B2
(45) Date of Patent: Feb. 23, 2016

(54) ELECTRICAL CONNECTOR PIN COVER

(71) Applicant: Hamilton Sundstrand Corporation, Windsor Locks, CT (US)

(72) Inventor: John A. Kleindienst, Rockford, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 184 days.

(21) Appl. No.: 14/079,216

(22) Filed: Nov. 13, 2013

(65) Prior Publication Data
US 2015/0130486 A1 May 14, 2015

(51) Int. Cl.
*G01R 31/00* (2006.01)
*G01R 1/18* (2006.01)
*H01R 4/72* (2006.01)
*G01R 31/02* (2006.01)

(52) U.S. Cl.
CPC .. *G01R 1/18* (2013.01); *H01R 4/72* (2013.01); *G01R 31/026* (2013.01)

(58) Field of Classification Search
CPC .... G01R 31/026; G01R 31/045; H01R 4/023; H01R 4/20; H01R 4/72; H01R 4/723; H01R 4/726; H01R 2201/20; H01R 9/2666; H01B 7/0045; H05K 2201/0125; H05K 2203/162; H05K 9/0069; H05K 1/0268; Y10S 439/912; Y10S 439/932
USPC ............. 324/750.26, 750.15, 754.01, 754.03, 324/754.1, 755.01, 755.11, 756.04, 538; 439/730, 738, 866, 932
See application file for complete search history.

(56) References Cited

U.S. PATENT DOCUMENTS

| | | | | |
|---|---|---|---|---|
| 4,245,189 A * | 1/1981 | Wahl | G01R 1/06788 | 324/716 |
| 4,497,533 A * | 2/1985 | Genova | H01R 13/6592 | 29/859 |
| 4,678,250 A * | 7/1987 | Romine | H01R 12/716 | 439/83 |
| 5,097,213 A * | 3/1992 | Hunting | G01R 31/043 | 324/519 |
| 5,098,319 A * | 3/1992 | McGaffigan | B23K 3/0475 | 174/DIG. 8 |
| 5,163,856 A * | 11/1992 | McGaffigan | B23K 3/0475 | 219/616 |
| 5,203,723 A * | 4/1993 | Ritter | H01R 13/521 | 439/589 |
| 5,406,031 A * | 4/1995 | Mathieu | H01R 4/723 | 174/84 R |
| 5,536,183 A * | 7/1996 | Brandolf | H01R 4/72 | 439/470 |
| 6,124,716 A * | 9/2000 | Kanamori | G01R 31/026 | 324/538 |
| 6,960,102 B2 * | 11/2005 | Styles | H01R 13/514 | 439/276 |
| 8,574,000 B1 * | 11/2013 | Smith | H01R 13/562 | 439/447 |
| 8,851,939 B2 * | 10/2014 | Bazenas | H01R 13/111 | 439/840 |
| 2010/0092588 A1 * | 4/2010 | Tabassi | B29C 45/281 | 425/3 |
| 2010/0323542 A1 * | 12/2010 | Boucher | H01R 13/4532 | 439/137 |

(Continued)

OTHER PUBLICATIONS

Auderer, Conducted Impulse Injection Method (CIIM), Universidad Politecnica de Catalunya, 2006.*

(Continued)

*Primary Examiner* — Patrick Assouad
*Assistant Examiner* — Sean Curtis
(74) *Attorney, Agent, or Firm* — Kinney & Lange, P.A.

(57) ABSTRACT

One embodiment includes a method for protecting from the accidental application of an electrical potential to an incorrect pin of a multipin electrical connector during testing. A sleeve is fitted around a pin that is not to have potential applied to it such that the pin is protected from accidental application of potential during testing.

9 Claims, 3 Drawing Sheets

(56) References Cited

U.S. PATENT DOCUMENTS

| | | | | |
|---|---|---|---|---|
| 2011/0163471 | A1* | 7/2011 | Lee | G03G 15/757 264/40.5 |
| 2013/0115788 | A1* | 5/2013 | Broughton | H01R 12/61 439/67 |
| 2013/0161093 | A1* | 6/2013 | Broughton | F02C 7/32 174/72 A |
| 2015/0130486 | A1* | 5/2015 | Kleindienst | G01R 1/18 324/750.26 |

OTHER PUBLICATIONS

Keithley, Solutions for Production Testing of Connectors, Keithley: A Tektronix Company, No. 2208, Rev Mar. 25, 2014.*

Auderer, Conducted Impulse Injection Method (CUM), Universidad Politecnica de Catalunya, 2006.*

Walko, A Test Technique for Measuring Lightning-Induced Voltages on Aircraft Electrical Circuits, NASA, Feb. 1974.*

Feudi et al., Fundamentals of DO-160F, Section 22: Lightning Induced Transient Susceptibility, In Compliance News, Jan. 2010.*
Watanabe et al., LSI Immunity Test Method by Direct GND Pin Injection, NEC Corporation, 2003 IEEE.*

Teseq, NSG 439 ESD Simulator, www.teseq.com/products/NSG-439.php, Aug 2013. (See Wayback Date).*

* cited by examiner

ELECTRICAL CONNECTOR PIN COVER

BACKGROUND

The present embodiments relate generally to an electrical connector and, more particularly, to protecting pins in an electrical connector from incorrectly having injection potential applied.

An electrical connector is a device which allows circuits to be joined. When used in commercial airplanes, an electrical connector joins the circuitry in a controller to an aircraft wiring harness. Circuitry in the controller can include, for example, discrete inputs and outputs, microprocessor boards, analog interface boards, and communications devices. The aircraft wiring harness connects the circuitry in the controller to other devices such as linear variable differential transformer (LVDT) based sensors, resolver based sensors, status lights, and communication buses. Some of the circuitry in the controller interfaces with sensors that are exposed to the outside world, such as sensors on the wings.

Because some of the circuitry in the controller interfaces with devices exposed to the outside world, it is required that such controller circuitry be tested to ensure it is able to withstand a lightning strike. Therefore, pin injection testing is used to simulate a lightning strike by applying high potential only to those pins in the electrical connector coupled to circuitry which interfaces with devices that could experience a lightning strike. This pin injection testing verifies whether the controller can withstand the requisite high potential applied. However, an electrical connector has many pins within it which couple to various circuitry, and only some of those pins couple to circuitry which interfaces with devices exposed to the outside world. Thus, during pin injection testing only some of the pins in the electrical connector are to have the high potential applied to them, whereas other pins are not to have potential applied to them. If potential is applied to an incorrect pin during pin injection testing, the controller may be damaged, possibly resulting in tens of thousands of dollars in damage and the inability to use the controller in further testing.

When electrical connectors are shipped, a plate may be installed over each block of the electrical connector to prevent damage. Such a plate may also be installed to cover an entire block of pins in an electrical connector to prevent potential from being applied to an incorrect pin. Installing the plate prevents injection potential from being applied to an incorrect pin within that block; however, this type of plate also prevents pins which are to be tested from being accessible. Therefore, to test an identified pin within the block, the plate must be removed, once again exposing pins that are not to be tested. Furthermore, when the plate is removed, there is no way to distinguish pins which are to have potential applied from those that are not to have potential applied without manually counting the pins to identify the pin number. This introduces the possibility of human error if the pins are not counted correctly.

SUMMARY

One embodiment includes a method of performing a pin injection test through a multipin electrical connector. Pins are identified which are not to have potential applied during the pin injection test. An electrical insulating sleeve is fitted around each identified pin to prevent potential from being applied to the identified pin. A pin injection test is performed at pins of the multipin electrical connector that are not fitted with one of the electrical insulating sleeves.

Another embodiment includes a method of identifying pins of a multipin electrical connector which are not to have potential applied during testing. Pins which are not to have potential applied are fitted with electrical insulating sleeves. A test is performed at pins which are not fitted with electrical insulating sleeves.

DETAILED DESCRIPTION

Generally, within a multipin electrical connector are numerous pins, some or all of which may be male and some or all of which may be female, and each of which may be coupled to different circuitry. Depending on the circuitry to which the pin is coupled, a high potential may need to be applied to the pin during testing to simulate a lightning strike. To distinguish those pins which are not to have potential applied, an electrical insulating sleeve is fitted around each of these pins.

Figure 1:
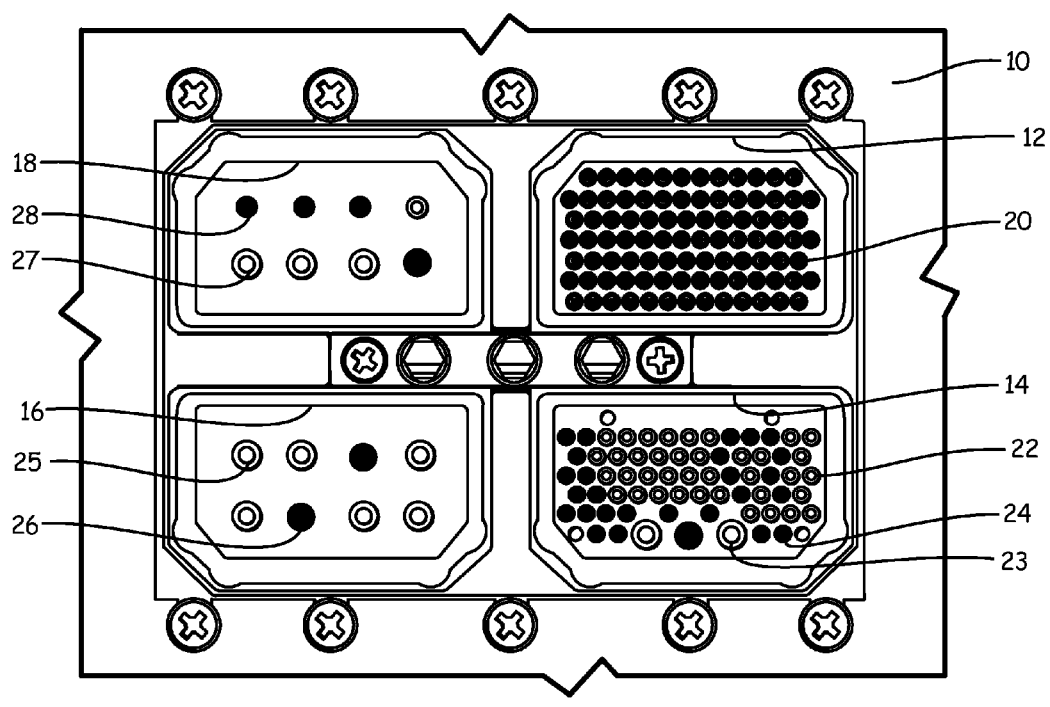
FIG. 1 is a side-elevational view of pins in a multipin electrical connector.

FIG. 1 shows a side-elevational view of multipin electrical connector 10, which is made up of multiple connector blocks 12, 14, 16, and 18. Electrical connector 10 is a multipin electrical connector, as it contains at least two pins which protrude outward from their locations within the blocks. For instance, block 12 contains a plurality of protruding female pins 20 in place within electrical connector 10. Block 14 contains a plurality of protruding male pins 22 and 23. Block 16 contains a plurality of protruding male pins, one of which is male pin 25. Block 18 contains a plurality of protruding male pins, one of which is male pin 27. However, not every opening for a pin within a block necessarily has a pin in place. For example, blocks 14, 16, and 18 each have multiple openings for pins where there are no pins in place, such as blanks 24, 26, and 28 respectively. Pins are located in place within an opening, for example, when there is circuitry for the pin to couple to and this circuitry needs to be joined via electrical connector 10 to other circuitry. Circuitry is joined, for example, by connecting an external male pin to female pin 20, or connecting an external female pin to male pin 22.

As can be seen in both block 12 and block 14 of electrical connector 10, there can be a plurality of pins in a single block. In some circumstances, only certain pins are identified to have potential applied during pin injection testing, whereas other pins are not to have potential applied. For example, during pin injection testing only those pins which couple to circuitry which interfaces with a device exposed to the outside world are to have potential applied. However, when there is a multipin electrical connector where pins are numerous as in block 12 and block 14, it can be difficult to distinguish pins which are to have potential applied from those which are not.

Although a pin number can be provided to help identify a pin which is to have potential applied, this requires manual counting of the pins to arrive at the identified pin, introducing the possibility of human error.

Figure 2A:
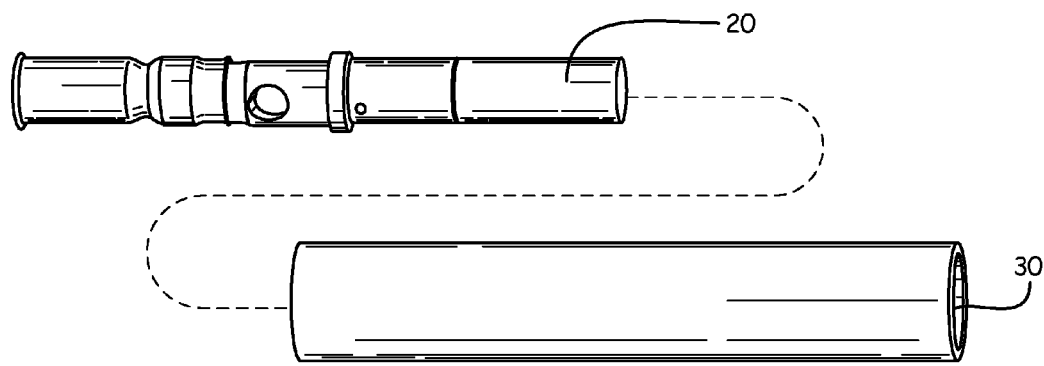
FIG. 2A is a perspective view of an electrical connector pin from the multipin electrical connector of FIG. 1 and an electrical insulating sleeve.

FIG. 2A shows female electrical connector pin 20, taken out of an electrical connector, and electrical insulating sleeve 30. Although female pin 20 is shown, any pin that will be located within an electrical connector and is not to have potential applied to it, whether male or female, or larger or smaller, can also be used. Pin 20 ordinarily is located in an electrical connector such that a portion of pin 20 protrudes outward from its location within a block of the electrical connector, as described for the pins in FIG. 1, with the remaining portion of pin 20 inserted within the block of the electrical connector. Sleeve 30 ordinarily is fitted around pins that are not to have potential applied, such as pin 20, to protect such pins from the application of potential.

Pin 20 is a pin identified which is not to have potential applied. A pin can be identified to not have potential applied, for example, because the pin couples to circuitry which interfaces with a device that is not exposed to the outside world. Another reason a pin can be identified to not have potential applied to it is that the circuitry to which the pin is coupled could not survive the level of potential that is to be applied. Additionally, if potential is being applied as part of pin injection testing, there may be at least one circuit, and therefore pin, which is exempt from testing under the test specification because, for example, it has not been altered and was previously tested. Therefore, the pin to which such a circuit is coupled would be identified to not be tested.

Sleeve 30 can be made of any electrical insulating material which is sized to fit around pin 20. For example, sleeve 30 can be made of material including rubber, silicone or heat shrink sleeving. However, the electrical insulating material used for sleeve 30 must be capable of being easily removed from the pin without leaving residue that could affect the pin's ability to mate with a connecting pin when sleeve 30 is removed. Sleeve 30 in FIG. 2A is 3M Heat Shrink Tubing, available from 3M Company, Maplewood, Minn. Sleeve 30 is of a size large enough to cover all of the portion of pin 20 that protrudes out from the electrical connector block, and would be of a different size when used with a different sized pin than pin 20. It is important to ensure sleeve 30 is of a size customized to fit pin 20 because when sleeve 30 is later fitted onto pin 20, its fitting can only be altered within a certain range to fit pin 20. For example, if sleeve 30 is sized too small and is fitted around pin 20 by applying heat such that sleeve 30 is shrunk onto the contour of pin 20, the entire protruded portion of pin 20 will not be fitted with sleeve 30. This may result in pin 20 failing to be protected from the application of potential. On the other hand, if sleeve 30 is sized too big and is fitted around pin 20 by applying heat such that sleeve 30 is shrunk onto the contour of pin 20, sleeve 30 can only be shrunk so far and will extrude too far out from pin 20 preventing pin 20 from installing in its location within the electrical connector.

Figure 2B:
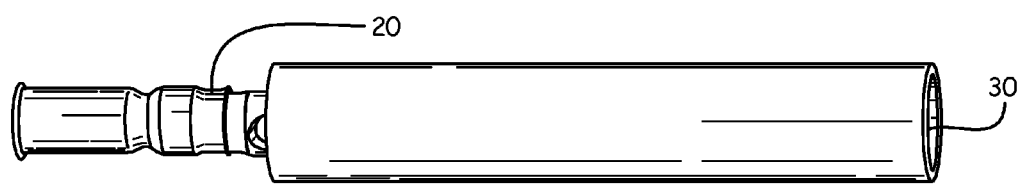
FIG. 2B is perspective view of the electrical insulating sleeve being fitted on and around the pin of FIG. 2A.

FIG. 2B shows a perspective view of sleeve 30 fitted on and around pin 20. Sleeve 30 can be fitted on and around pin 20 while pin 20 is in place within an electrical connector. In that case, sleeve 30 is fitted over that portion of pin 20 that protrudes outward from its location within the block with sleeve 30 extending out further from this protruding end of pin 20, as shown in FIG. 2B. Alternatively, sleeve 30 can be fitted on and around pin 20 after pin 20 has been removed from its place within the electrical connector. Then, once sleeve 30 is fitted on and around pin 20, it can be placed back inside the electrical connector. If pin 20 is removed from its place within the electrical connector, sleeve 30 can be fitted on and around entire pin 20 if sleeve 30 is of a material thin enough such that it fits tightly enough onto pin 20 allowing pin 20 to be installed in its place within the electrical connector. Otherwise, sleeve 30 is fitted only over that portion of pin 20 that protrudes outward from its location within the block, as shown in FIG. 2B.

Depending on the material of sleeve 30, it can then be secured onto pin 20. Sleeve 30 can be secured, for example, by use of a band clamp. Securing sleeve 30 around pin 20 with a band clamp obviates the need to apply adhesive material to pin 20, which may leave residue preventing pin 20 from mating with a connecting pin while in place within the electrical connector. However, sleeve 30 must be of a material thin enough to fit tightly onto pin 20 when secured such that pin 20 and sleeve 30 fit into the electrical connector.

Figure 2C:
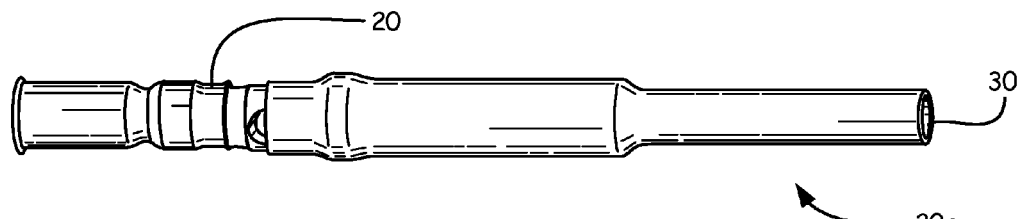
FIG. 2C is a perspective view in which the electrical insulating sleeve is a heat shrink sleeving fitted on and around the electrical connector pin of FIG. 2A.

FIG. 2C shows sleeve 30, after it has been heat shrunk fitted onto the contour pin 20. This results in sleeved pin 20s. Heat can be applied, for example, through the use of a heat gun. The total time it can take to get from separate pin 20 and sleeve 30 shown in FIG. 2A, to sleeved pin 20s of FIG. 2C is approximately less than three minutes. Sleeve 30 can be fitted on and around, and thus heat shrunk onto, pin 20 either while pin 20 is in place within an electrical connector, or while pin 20 is removed from the electrical connector.

Figure 3:
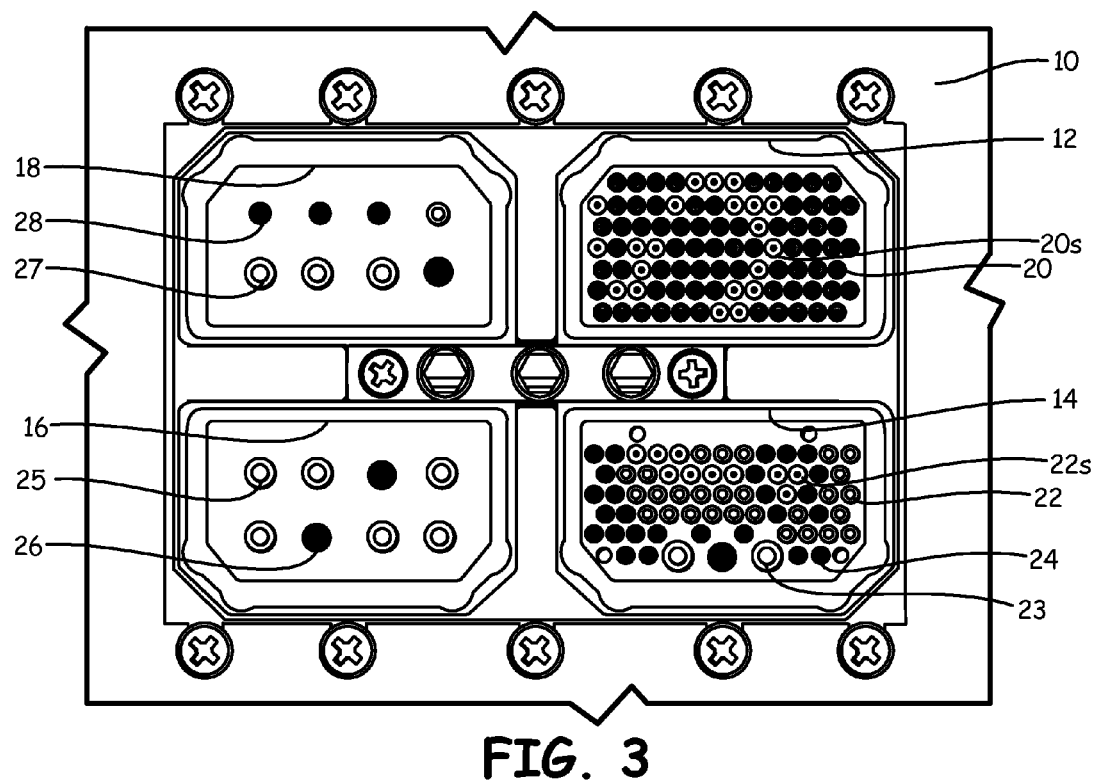
FIG. 3 is a side-elevational view of the multipin electrical connector of FIG. 1 prepared for pin injection testing, with pins which are not to have potential applied fitted with electrical insulating sleeves, and pins which are to have potential applied not fitted with electrical insulating sleeves.

FIG. 3 shows a side-elevational view of electrical connector 10 of FIG. 1, with pins which are not to have potential applied fitted with sleeves and pins which are to have potential applied not fitted with sleeves. Electrical connector 10 is made up of multiple blocks 12, 14, 16, and 18. Block 12 contains a plurality of female pins, which are not fitted with sleeves (pins 20), and others (pins 20s) which are fitted with sleeves. Block 14 contains a plurality of protruding male pins, some of which are not fitted with sleeves (pins 22 and 23), and others which are fitted with sleeves (pins 22s). Block 16 contains a plurality of protruding male pins 25, none of which are fitted with sleeves. Block 18 contains a plurality of protruding male pins 27, none of which are fitted with sleeves. Pins are identified to not have potential applied, and thus fitted with sleeves, for various reasons as detailed for FIG. 2A. Blocks 14, 16, and 18 still have multiple openings where there are no pins in place, such as blanks 24, 26, and 28 respectively.

Pins in electrical connector 10 that are fitted with sleeves (pins 20s and 22s) were fitted while in place within electrical connector 10. Sleeve 30 on each identified pin is heat shrink sleeving which was fitted on and around the pin while in place within electrical connector 10 by applying heat from a heat gun to shrink the heat shrink sleeving onto the contour of the pin. Heat from the heat gun was applied for approximately 1 to 2 minutes, or until the sleeve 30 was tightly shrunk onto the contour of the pin. Each sleeve 30 on an identified pin 20s, 22s in electrical connector 10 is fitted onto that portion of the pin that protrudes outward from its location within a block of electrical connector 10.

By fitting sleeves onto pins which are not to have potential applied, accidental application of potential to pins 20s, 22s is prevented. For example, it is clear when applying potential to pins in electrical connector 10 of FIG. 3 that only pins which do not have a sleeve fitted around them (pins 20, 22, 23, 25, and 27) are to have potential applied. Indeed, pin 20s or 22s would be very difficult to connect to in order to apply potential, as sleeve 30 covers the pin such that mating the appropriate male or female connection is very difficult, if not impossible, to do without first removing sleeve 30. This results in preventing potentially thousands of dollars in damage to circuitry that can occur if unintended potential is applied to an incorrect pin.

Electrical connector 10 of FIG. 3, a multipin electrical connector, can be used during pin injection testing. Pin injection testing is an industry standard test that is used to qualify airborne equipment as capable of withstanding a lightning strike. Potential is applied to circuitry through the test pin to which the circuitry is coupled, to ensure that the circuitry can withstand a lightning strike. The test specification is laid out in RTCA DO-160 "Environmental Conditions and Test Procedures for Airborne Equipment," section 22 "Lightning Induced Transient Susceptibility." In one embodiment, pins are identified that are not to be tested, meaning no potential will be applied to the identified pins. Pins that are not to be tested can be identified for any reason, including reasons similar to those detailed for FIG. 2A. A sleeve is fitted around each pin that is not to be tested, similar to that detailed for FIGS. 2A, 2B, and 2C, either while the pin is in place within the electrical connector or by removing the pin from the electrical connector and reinstalling it once fitted with a sleeve. Potential is then applied to test pins that are not fitted with a sleeve. After potential has been applied to all pins being tested, and thus testing is complete, the sleeves are removed from the pins not being tested. The sleeve material must be such that residue is not left on the pin when the sleeve is removed that would prevent the pin from mating with a connecting pin to join circuitry. Sleeves can be removed while the pins are in place within the electrical connector or by removing the pins from the electrical connector and then removing the sleeves.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A method of performing a pin injection test through a multipin electrical connector, the method comprising:
    identifying pins which are not to have potential applied during the pin injection test;
    fitting an electrical insulating sleeve around each identified pin to prevent potential from being applied to the identified pin; and
    performing a pin injection test at pins of the multipin electrical connector that are not fitted with one of the electrical insulating sleeves.

2. The method of claim 1 wherein the electrical insulating sleeve is fitted around a protruded portion of the identified pin.

3. The method of claim 1 wherein the electrical insulating sleeve is a heat shrink sleeving.

4. The method of claim 3 wherein the heat shrink sleeving is fitted around the identified pin by applying heat such that the heat shrink sleeving is shrunk onto the contour of the identified pin.

5. The method of claim 1 wherein fitting an electrical insulating sleeve is performed while the identified pin is in place within the electrical connector.

6. The method of claim 1 wherein fitting an electrical insulating sleeve is performed by removing the identified pin from the multipin electrical connector, fitting the electrical insulating sleeve around the identified pin, and installing the identified pin back inside the multipin electrical connector.

7. A method comprising:
    identifying pins of a multipin electrical connector which are not to have potential applied during testing;
    fitting pins which are not to have potential applied with electrical insulating sleeves; and
    performing a test at pins which are not fitted with electrical insulating sleeves.

8. The method of claim 7 wherein the electrical insulating sleeves are heat shrink sleeving.

9. The method of claim 8 wherein the heat shrink sleeving is fitted around the identified pin by applying heat such that the heat shrink sleeving is shrunk onto the contour of the pin.

* * * * *